United States Patent [19]

DeCamp et al.

[11] Patent Number: 5,761,080
[45] Date of Patent: Jun. 2, 1998

[54] METHOD AND APPARATUS FOR MODELING CAPACITANCE IN AN INTEGRATED CIRCUIT

[75] Inventors: William F. DeCamp, Burlington; John J. Ellis-Monaghan, Grand Isle; Peter A. Habitz, Hinesburg; Edward W. Seibert, Richmond, all of Vt.

[73] Assignee: International Business Machines Corporation, Armonk, N.Y.

[21] Appl. No.: 561,647

[22] Filed: Nov. 22, 1995

[51] Int. Cl.$^6$ .................................................. G06F 17/50
[52] U.S. Cl. ........................ 364/490; 364/488; 395/921
[58] Field of Search ................ 395/500; 364/488–491, 364/578

[56] References Cited

U.S. PATENT DOCUMENTS

| | | | |
|---|---|---|---|
| 4,823,278 | 4/1989 | Kikuchi et al. | 364/491 |
| 4,829,446 | 5/1989 | Draney | 364/488 |
| 5,062,054 | 10/1991 | Kawakami et al. | 364/491 |
| 5,084,824 | 1/1992 | Lam et al. | 364/490 |
| 5,295,088 | 3/1994 | Hartoog et al. | 364/578 |
| 5,305,229 | 4/1994 | Dhar | 364/489 |
| 5,367,469 | 11/1994 | Hartoog | 364/491 |
| 5,446,674 | 8/1995 | Ikeda et al. | 364/489 |
| 5,452,224 | 9/1995 | Smith et al. | 364/488 |
| 5,640,497 | 6/1997 | Woolbright | 395/133 |

FOREIGN PATENT DOCUMENTS

| | | | |
|---|---|---|---|
| 403089531A | 4/1991 | Japan | H01L 21/66 |

OTHER PUBLICATIONS

Huang, C.C., Integral Technique For Capacitance Calculator, *IBM Technical Disclosure Bulletin*, Feb. 1992, vol. 34, No. 9, pp. 429–432.

Marple, David, Tailor: A Layout System Based on Trapezoidal Corner Stitching, *IEEE Transactions on Computer-Aided Design*, vol. 9, No. 1, pp. 66–90.

Weyten, Ludo, Quad List Quad Trees: A Geometrical Data Structure with Improved Performance for Large Region Queries, *IEEE Transactions on Computer-Aided Design*, vol. 8, No. 3, pp. 229–233.

*Primary Examiner*—Kevin J. Teska
*Assistant Examiner*—Russell W. Frejd
*Attorney, Agent, or Firm*—Schmeiser, Olsen & Watts; Robert A. Walsh, Esq.

[57] ABSTRACT

According to the present embodiment, a method for calculating the parasitic capacitance in a semiconductor device is disclosed. According to the preferred method, a layout file containing the shapes of a semiconductor device is provided. The dimensions of the layout file are then adjusted to wafer dimensions so as reflect actual production devices. The shapes of the layout file are then partitioned into simpler shapes, typically abutted rectangles, called tiles. Each tile is then decomposed into overlap and fringe capacitance components, each component having a uniform capacitance environment with respect to its capacitance elements. The parasitic capacitance of the semiconductor device can thus be accurately computed, with an efficient use of resources. Additionally the preferred embodiment is easily adaptable to a wide range of technology types.

41 Claims, 10 Drawing Sheets

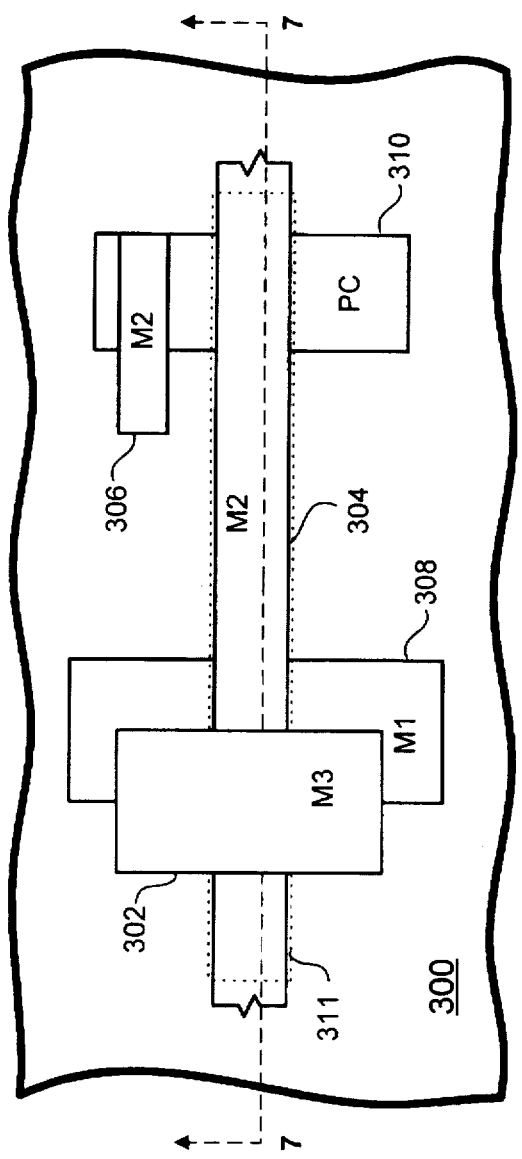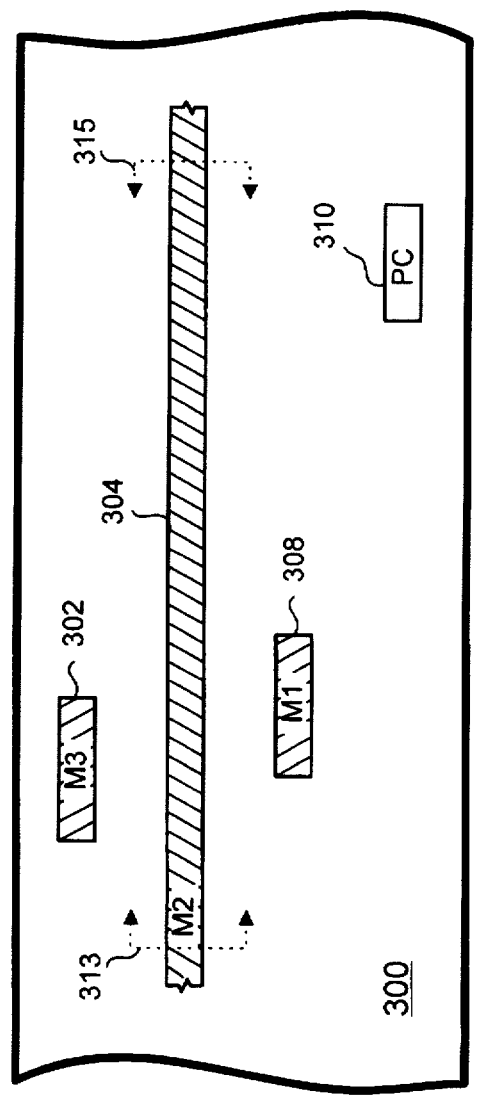

5,761,080

METHOD AND APPARATUS FOR MODELING CAPACITANCE IN AN INTEGRATED CIRCUIT

BACKGROUND OF THE INVENTION

1. Technical Field

This invention generally relates to a circuit design, and more specifically relates to computing the capacitance of VLSI circuit elements.

2. Background Art

Parasitic capacitance is defined as capacitance derived from conductor lines passing over or adjacent to each other and are a function of the area, geometry, material, and voltages of the device itself and of neighboring circuits. Parasitic capacitance causes several problems in VLSI chip design. First, parasitic capacitance can make portions of the circuit operate slower, creating operational problems. Second, parasitic capacitance can make portions of the circuit speed up, creating race conditions. Third, parasitic capacitance can introduce coupling between circuits, creating noise.

Prior methods of calculating parasitic capacitance were based upon numerical solutions or relatively simple geometries derived from hand or computer-assisted analysis of schematic and shapes files fed into simple capacitance models involving only two conductors at a time. Thus, prior methods yielded results with excessive computation time or excessive error.

Various methods have been used to compute the parasitic capacitances of VLSI circuits. For example, U.S. Pat. No. 5,452,224 "Method of Computing Multi-Conductor Parasitic Capacitances for VLSI Circuits" (issued to Smith, Jr. et al. Sep. 19, 1995 and assigned to Hughes Aircraft Co.) discloses a method of computing the parasitic capacitances by subdividing a semiconductor device into windows and of computing the capacitance of each conductor with a given window based on the other conductors within that same widow. The method uses a numerical analysis method of capacitance calculation, requiring iterative solutions to complex mathematical problems, and thus has the disadvantage of requiring excessive computational resources.

Therefore, there existed a need to provide a more precise and time efficient method of calculating the parasitic capacitance of a VLSI device. Also, there existed a need to provide a method of calculating the parasitic capacitance that could be applied to a wide range of device types and complexity.

DISCLOSURE OF INVENTION

According to the present embodiment, a method for calculating the parasitic capacitance in a semiconductor device is disclosed. According to the preferred method, a layout file containing the shapes of a semiconductor device is provided. The dimensions of the layout file are then adjusted to wafer dimensions so as to reflect actual production devices. The shapes of the layout file are then partitioned into simpler shapes, typically rectangles, called tiles. Each tile is then decomposed into overlap and fringe capacitance components, each component having a uniform capacitance environment with respect to its capacitance elements. The parasitic capacitance of the semiconductor device can then be accurately computed, with an efficient use of resources. Additionally, the preferred embodiment is easily adaptable to a wide range of technology types.

The foregoing and other objects, features and advantages of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and:

FIG. 6 is a top view of a portion of a semiconductor device;

FIG. 7 is a cross sectional side view of a portion of a semiconductor device taken along line 7—7 of FIG. 6;

BEST MODE FOR CARRYING OUT THE INVENTION

The method and apparatus of the preferred embodiment are used to model and calculate the parasitic capacitance of a large scale VLSI semiconductor device. The method of the preferred embodiment utilizes a model that takes into account the capacitance effects of surrounding structures in the three dimensions surrounding the "line" under consideration.

Figure 1:
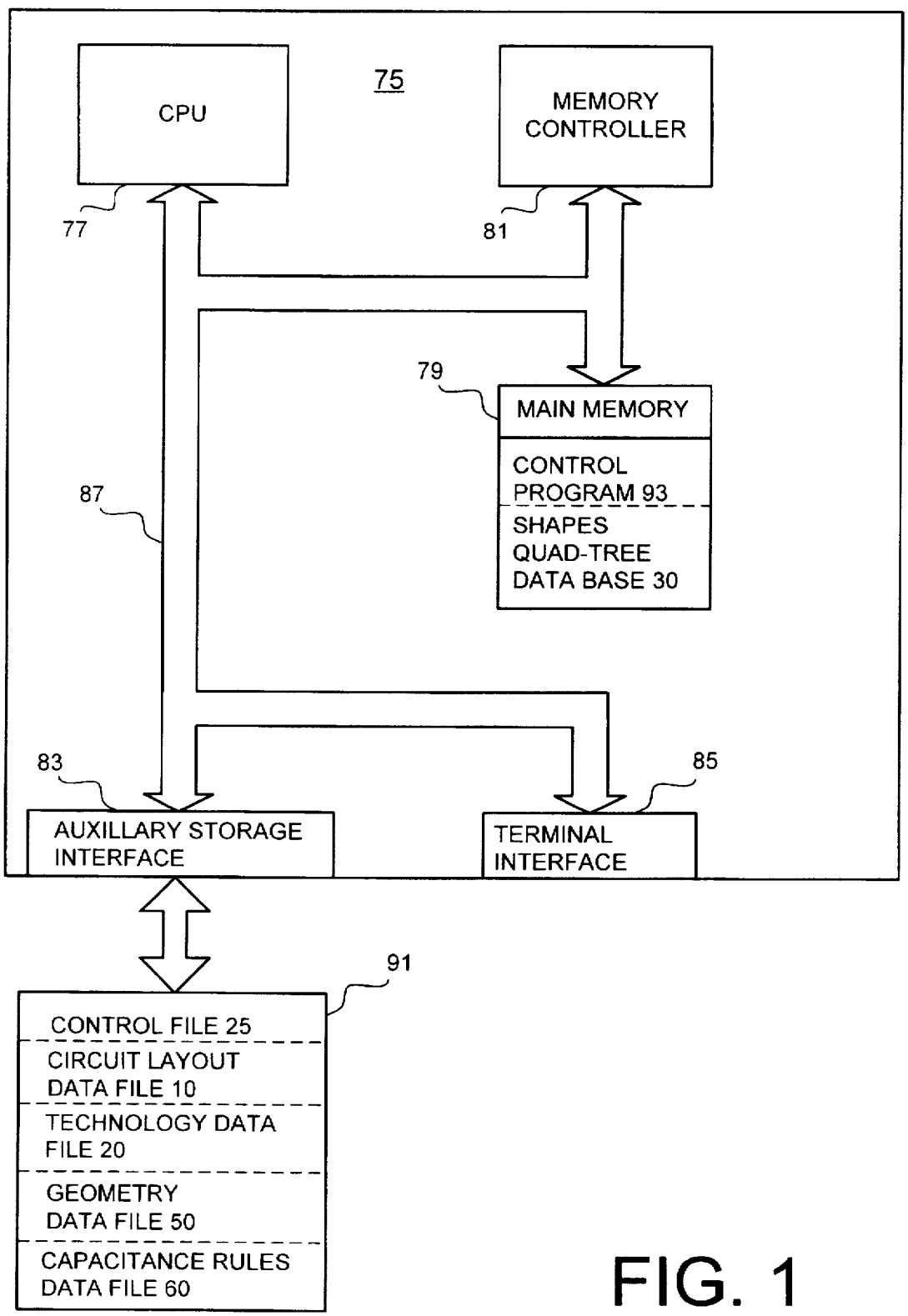
FIG. 1 is a schematic block diagram of a computer system in accordance with the present invention.

Referring to FIG. 1, a computer system 75 in accordance with the present invention is an enhanced IBM RS/6000 workstation. However, those skilled in the art will appreciate that the mechanisms and apparatus of the present invention apply equally to any computer system, regardless of whether the computer system is a complicated multi-user computing apparatus or a single user device such as a personal computer or workstation. Computer system 75 suitably comprises a CPU 77, main memory 79, memory controller 81, auxiliary storage interface 83, and terminal interface 85, all of which are interconnected via a system bus 87. Note that various modifications, additions, or deletions may be made to the computer system 75 illustrated in FIG. 1 within the scope of the present invention such as the addition of cache memory or other peripheral devices; FIG. 1 is presented to simply illustrate some of the salient features of computer system 75.

Main memory 79 typically stores control program 93, which directs the activities of computer system 75. In accordance with the preferred embodiment, main memory 79 also stores shapes quad-tree data base 30. Typically, shapes quad-tree data base 30 is created in accordance with the method of the preferred embodiment, and are used in modeling of device capacitance. The contents and use of shapes quad-tree data base 30 will be discussed in relation to FIGS. 2–11.

Auxiliary storage interface 83 is used to allow computer system 75 to store and retrieve information from auxiliary storage 91. Auxiliary storage 91 can be any type of electronic storage medium, such as magnetic disk (e.g., hard disks or floppy diskettes) or optical storage devices (e.g., CD-ROM). In the preferred embodiment, auxiliary storage 91 accesses control file 25, circuit layout data file 10, technology data file 20, capacitance rules data file 60 and geometry data file 50. Of course, as is well understood, these files could be stored elsewhere. The contents and use of the various files will be discussed in relations to FIGS. 2–11. Additionally, auxiliary storage 91 can be used to store the outputs generated by the program of the preferred method.

Memory controller 81, through use of a processor separate from CPU 77, is responsible for moving requested information from main memory 79 and/or through auxiliary storage interface 83 to CPU 77. While for the purposes of explanation, memory controller 81 is shown as a separate entity, those skilled in the art understand that, in practice, portions of the function provided by memory controller 81 may actually reside in the circuitry associated with CPU 77, main memory 79, and/or auxiliary storage interface 83.

Terminal interface 85 allows users and computer programmers to communicate with computer system 75, normally through programmable workstations. Although the system 75 depicted in FIG. 1 contains only a single main CPU 77 and a single system bus 87, it should be understood that the present invention applies equally to computer systems having multiple main CPUs and multiple I/O buses. Similarly, although the bus 87 of the preferred embodiment is a typical hardwired, multidrop bus, any connection means that supports bi-directional communication could be used.

The remainder of this specification describes how the present invention operates under the direction of control program 93.

Figure 2:
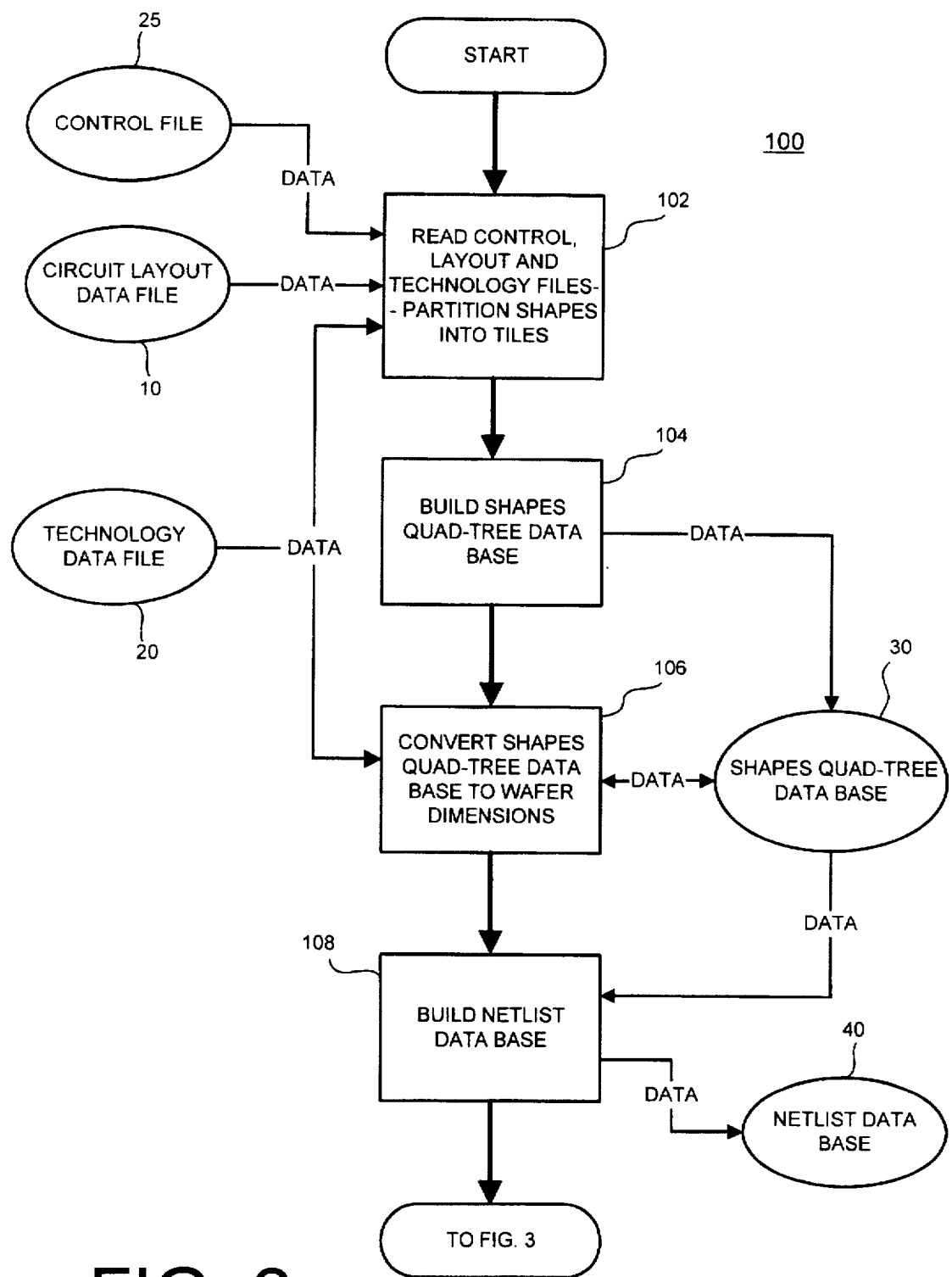
FIG. 2 is a flow diagram of a first portion of a capacitance modeling method in accordance with a preferred embodiment of the present invention.

Turning now to FIG. 2, FIG. 2 is a flow diagram of a first portion of a capacitance modeling method 100 in accordance with a preferred embodiment of the present invention. The first step 102 is to read the information contained in the circuit layout data file 10, the technology data file 20, and control file 25 and to partition the shapes into tiles.

Circuit geometrical information, namely the shape of the device, is provided from a circuit layout data file 10. The circuit layout data file 10 is typically created by the design process. It is the unique layout file that represents all or part of a semiconductor device that will have its parasitic capacitance computed. For example, circuit layout data file 10 would typically contain the shapes of all components to be built into the semiconductor device. The parameters in circuit layout data file 10 include the location of each point on the shapes and the layer each shape is on. Because the circuit layout data file 10 contains the physical structure of the device to be modeled, the circuit layout data file 10 serves as the master input to the preferred method.

Technology data file 20 describes the process parameters for the fabrication process. Thus, physical material parameters such as dielectric constants and production wafer dimensions differences are provided by technology data file 20. Typically, a different technology data file would exist for each type of fabrication process, such as the various CMOS and bipolar processes. The use of technology data file 20 thus allows the preferred method to be easily used on multiple types of fabrication processes by simply switching files. Technology data file 20 would typically contain parameters such as minimum gate width and minimum channel width. The technology data file 20 can also include such parameters as metal layer thicknesses and the distances between metal layers. The tolerances for these parameters can also be included, and thus the file could also include nominal, best and worst case dimensions.

The parameters in technology data file 20 can be obtained from a design rule checks database, and converted to wafer dimensions. Typically a design rule checks database determines important parameters at design dimensions, and the dimensions at wafer dimension and the tolerances. This allows the wafer dimensions to be calculated for any given shape.

The parameters stored in circuit layout data file 10 are used in conjunction with technology data file 20, which are together used to define the physical layout of the semiconductor device. The physical layout includes the types of elements to be used, the number and shapes of the various layers of the semiconductor device. The preferred method has the advantage of being easily adaptable to different circuit designs and different fabrication technology. By simply changing technology files the method can be adapted from one fabrication type to another.

Control file 25 determines the types of calculations and modeling that are to be completed by the preferred method. For example, control file 25 can be used to select the particular technology file, and the particular process corner the circuit is to be evaluated at, such as nominal, best or worst case. Additionally, control file 25 can determine whether additional parameters, such as parasitic resistance, are to be computed.

Control file 25 can also be used to account for the positions of global wiring outside the semiconductor device. Global wiring is used to connect various semiconductor devices in a larger circuit together, where the larger circuit is for example a chip. Also, global wiring is used to connect devices of separate circuits. Typically, the global wiring is generated by an automatic routing/wiring program which run over that device when incorporated into a larger circuit. Because of this, the location of the global wiring is often not included in the circuit layout file 10. Additionally, one semiconductor device can often be used at many different locations on a chip, with the possibility of different interconnect wires running over each placement of the device. Again these possibilities may not be included in circuit layout file 10. In the preferred embodiment, control file 25 can be used to account for capacitance created by the global wiring, and not included in circuit layout file 10.

The preferred method uses a flexible specification in control file 25 to account for capacitance that may be created by global wiring. In the case where the position of the global wiring is known but not included in circuit layout file 10, it can be included in control file 25 and calculated according to the method of the present invention. In the case where the position of the global wiring is not known, the effects of possible global wiring placements can be evaluated at different process corners. For example, control file 25 can specify that capacitance due to global wiring be evaluated at a worst case process corner such that capacitance is calculated assuming that the device is fully covered by interconnect wires, even though the wires are not present in circuit layout file 10. Conversely, control file 25 can specify that the effects be evaluated for the best case process corner where no interconnect wires are assumed to cross above the circuit, unless the wires are already included in the circuit layout file.

Thus, the capacitance modeling method 100 uses circuit layout data file 10, technology data file 20, and control file 25 to determine the circuit shapes of the semiconductor device, the parameters to be calculated and the relevant process corner.

The circuit shapes that are to be modeled are then divided up into a plurality of tiles. This is typically done on a layer by layer process through the semiconductor device. As previously stated, the circuit layout shapes are obtained from circuit layout data file 10, as modified by technology data file 20. The shapes of the semiconductor device typically comprise a variety of forms, including complex polygons.

The shapes are then decomposed into tiles. In particular, the complex polygons are all broken down into tiles of simpler shapes. In one preferred embodiment, the tiles comprise butted orthogonal rectangles, arranged to encompass all components of the semiconductor device. One preferred method for decomposing the shapes into tiles comprises representing the complex polygon as a circular list of vertex points, with the last point pointed back to the first. A random point and two points ahead of that point are selected. Then, it is determined if those points define an inside area. If so, examine the remaining points to determine if any of them are inside that area. If so, that polygon cannot be removed. Otherwise, the polygon is removed and the process is continued until all shapes are broken down to orthogonal rectangles.

In another embodiment, the tiles comprise trapezoids. In this embodiment, trapezoidal corner stitching would be used to decompose the complex polygons into trapezoid tiles. For further information on trapezoidal corner stitching, see "Tailor: A Layout System Based Upon Trapezoidal Corner Stitching," David Marple, Michield Smulders and Henk Hegen, IEEE Transactions on Computer-Aided Design, Vol. 9, No. 1, January 1990, which is hereby incorporated by reference.

The next step 104 is to build a shapes data base 30. The parameters for each shape, including the tiles contained in each shape, are stored in shapes data base 30. Typically, a shapes data base 30 is created for each layer of the semiconductor device. In a preferred embodiment, the shapes data base 30 has a quad-tree data structure. Quad-tree data base structures allow for efficient retrieval and use of the various parameters, including the location of tiles, in the shapes data base. For further information on the use of a quad-tree data base, see "Quad List Quad Trees: A Geometrical Data Structure with Improved Performance for Large Region Queries," Ludo Weyten and Wim De Pauw, IEEE Transactions on Computer-Aided Design, Volume 8, No. 3, pp 229–233, March 1989, which is hereby incorporated by reference. Of course, other data bases with different data structures could also be used.

Preferably, the shapes quad-tree data base 30 is stored directly in memory. This allows for fast and efficient retrieval of information, without the delays associated with a disk-based data base storage method.

The next step 106 is to convert shapes quad-tree data base 30 into exact wafer dimensions. To do this, the shapes quad-tree data base 30 is adjusted according to the differences caused by various process differences as stored by technology data file 20. This results in layout data that accurately describes the dimensions of the circuit as produced in fabrication. In particular, each tile of all shapes will be accurately measured. In a preferred method, technology data file 20 contains executable files to make automatic compensations for process variations caused by different technologies to the parameters stored in shapes quad-tree data base 30.

Typically, step 106 is accomplished by reading a shape from quad-tree data base 30, then that shape is converted to wafer dimensions with technology data file 20. That wafer dimension shape is then stored in quad-tree data base 30.

The next step 108 is to build a netlist data base 40. This is done by analyzing the shapes and tiles of a semiconductor device, and determining which define complete conductors of electrical nets. Netlist data base 40 thus contains a list of shapes and tiles that comprise a particular electrical net. In particular, every tile contains a pointer to the netlist database. Netlist data base 40 also contains the location and type of the various semiconductor elements on the device, as well as the connectivity between the elements.

Figure 3:
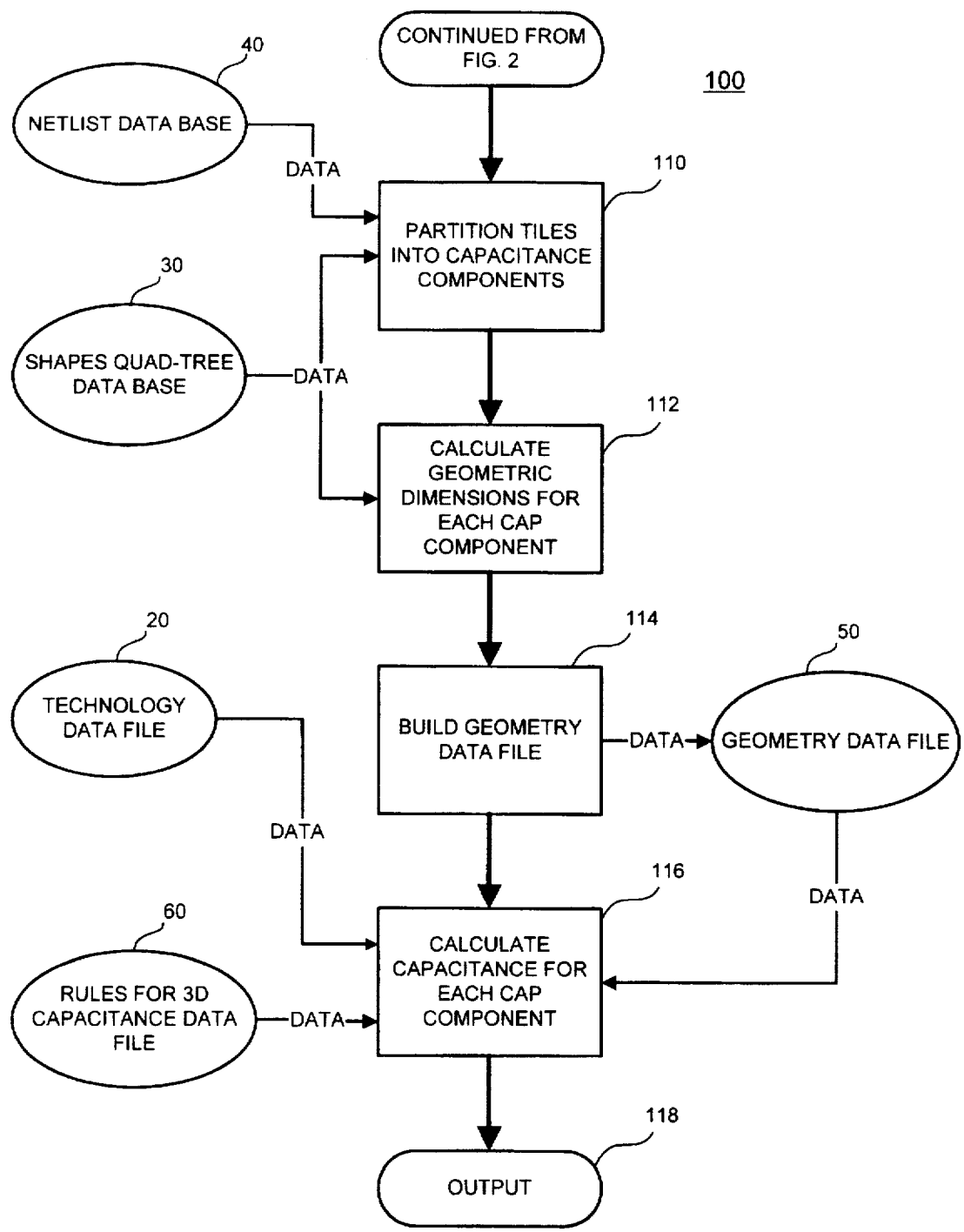
FIG. 3 is a flow diagram of a second portion of a capacitance modeling method in accordance with a preferred embodiment of the present invention.

Turning now to FIG. 3, FIG. 3 is a flow diagram of a second portion of capacitance modeling method 100 in accordance with a preferred embodiment of the present invention.

The next step 110 is to partition each tile into capacitance components. This is accomplished with netlist data base 40 and shapes quad-tree data base 30. Preferably each capacitance component reflects a portion of a tile, at its effective capacitance width consistent with the 3D capacitance models, that has a uniform parasitic capacitance environment with respect to nearby features. In particular, the capacitance components are selected such that all significant interactions with neighboring shapes are included. Thus, the capacitance components have a uniform parasitic capacitance environment to a specified tolerance, where the tolerance is a parameter that can be chosen in control file 25.

In the preferred embodiment, each tile is first decomposed into overlap parasitic capacitance components. Next, each tile is decomposed into fringe parasitic capacitance components.

Figure 4:
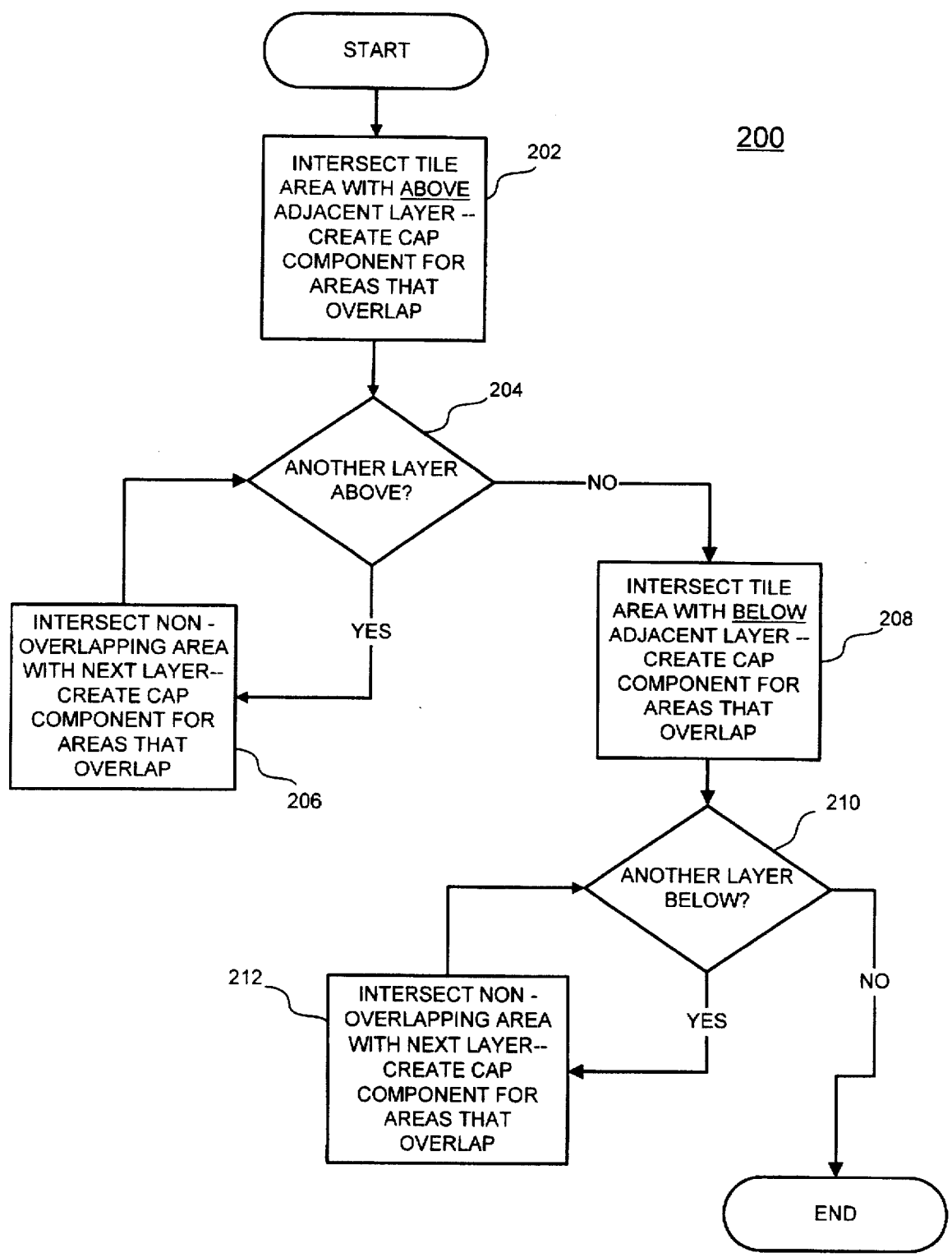
FIG. 4 is a flow diagram illustrating a decomposition method in accordance with a preferred embodiment of the present invention.

First, each tile is decomposed into overlap parasitic capacitance components. Turning now to FIG. 4, FIG. 4 is a flow diagram illustrating an overlap decomposition method 200. In this embodiment, using recursive decomposition, a tile can be decomposed into areas of uniform parasitic capacitance relative to overlap capacitance. In particular, the decomposition method 200 subjects the tile to a recursive intersect/complement series in order to determine what portion of the tile is "visible" to other layers in the semiconductor device. This is typically done first with layers above the tile, and then done with layers below the tile.

The first step 202 of decomposition method 200 is to intersect the tile with an adjacent layer above, if one exists. Areas that overlap, or "talk," create overlap parasitic capacitance. An overlap capacitance component is created for each area that overlaps. A decision 204 is then made as to whether there are additional layers above the tile. If there is another layer, the next step 206 is to intersect the areas of the tile that did not overlap the adjacent layer with the next layer. These areas which overlap the next layer, but did not overlap the adjacent layer, also "talk" and create overlap parasitic capacitance. Again, an overlap capacitance component is created for each area that overlaps. The process then returns to decision 204. The process of intersecting sections out is continued until the entire tile is partitioned or until no more layers exist above the tile. Additionally, parasitic capacitance components are created for tile sections that have no shapes above them. These components can be used in calculating the possible parasitic capacitance effects of global interconnect wiring when necessary.

The method now repeats the intersection process with layers below the tile. Namely, the next step 208 intersects the tile with the adjacent layer below the tile, if one exists. Areas that overlap, or "talk," create overlap parasitic capacitance. An overlap capacitance component is created for each area that overlaps. A decision 210 is then made as to whether there are additional layers below the tile. If there is another layer, the next step 212 is to intersect the areas of the tile that did not overlap the adjacent layer with the next layer below. These areas which overlap the next layer, but did not overlap the adjacent layer, also "talk" and create overlap parasitic capacitance. Again, an overlap capacitance component is created for each area that overlaps. The process then returns to decision 210. The process of intersecting sections out is continued until the entire tile is partitioned or until no more layers exist below the tile. Tile areas with no conductor layers below interact and create parasitic capacitance with the semiconductor device substrate. Thus, parasitic capacitance components are created for all tile sections, even those that have no shapes below them The method 200 is repeated for all tiles in the semiconductor device. The method 200 thus decomposes each tile into sections that have uniform parasitic capacitance environments with respect to overlap capacitance.

The result is that each tile is partitioned into a plurality of overlap capacitance components, each having a uniform parasitic capacitance environment, within a specified tolerance, with regard to overlap capacitance. From this, as part of step 116 of FIG. 3, the overlap parasitic capacitance of each tile can be accurately calculated.

Figure 5:
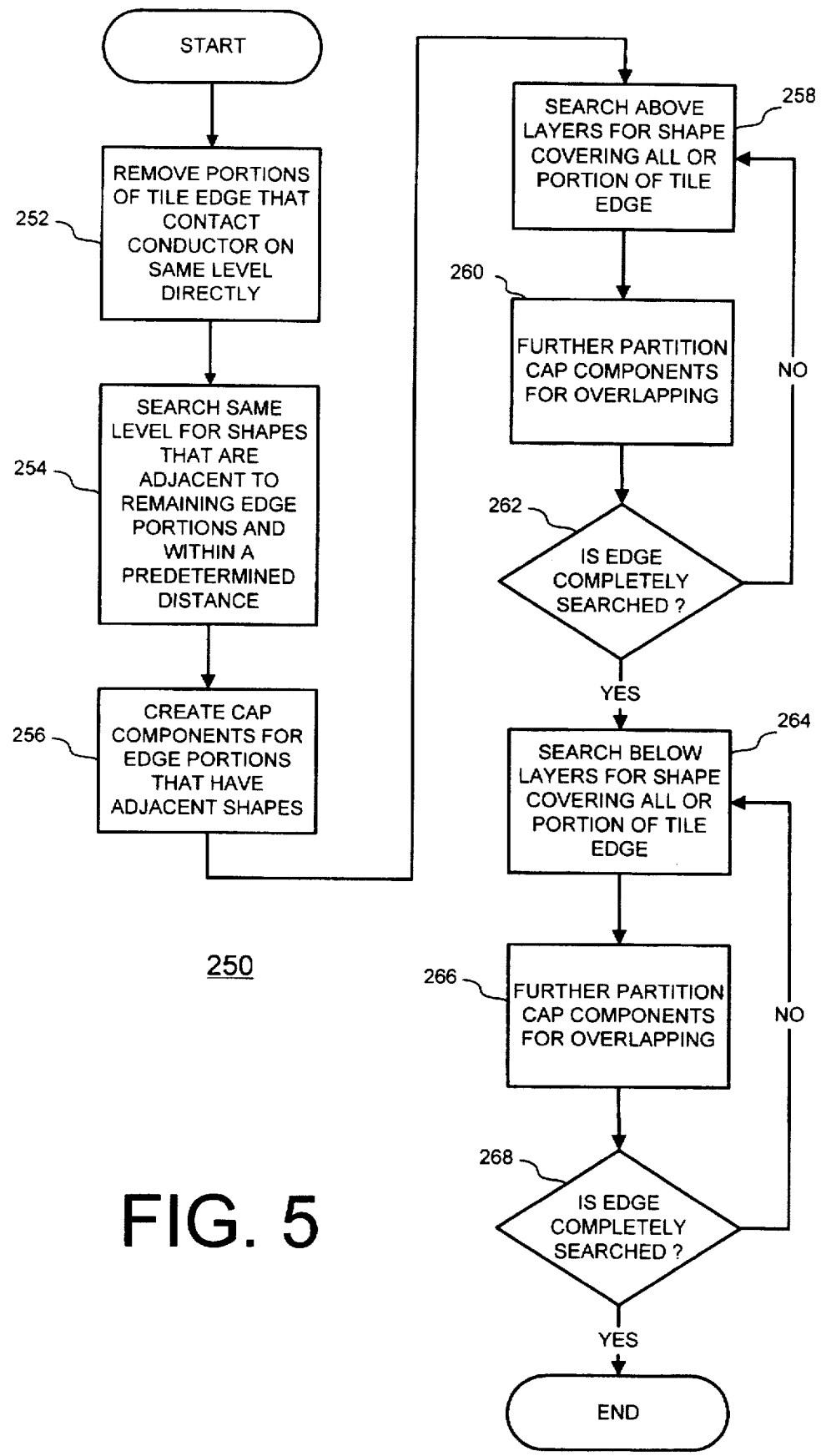
FIG. 5 is a flow diagram illustrating a decomposition method in accordance with a preferred embodiment of the present invention.

Next, each tile is decomposed into fringe parasitic capacitance components. Turning now to FIG. 5, FIG. 5 is a flow diagram illustrating a decomposition method 250, to decompose a tile into fringe capacitance components. The preferred decomposition method 250 is an edge-based method. The method 250 decomposes the edges of each tile into a plurality of edge-based capacitance components. In particular, each edge is preferably decomposed into components that have uniform fringe line-to-line, fringe-up, and fringe-down parasitic capacitance environments.

The preferred decomposition method 250 operates by first decomposing the edges for fringe line-to-line capacitance, into sections that have uniform parasitic capacitance environments with respect to line-to-line capacitance. Next, these edge sections are further decomposed for fringe-up and fringe-down capacitance. This results in the edges of the tile being decomposed into components that have uniform capacitance environments, within a specified tolerance, with respect to fringe line-to-line, fringe-up, and fringe-down capacitance.

This two-step decomposition is required when using the preferred capacitance model, because fringe line-to-line capacitance depends on whether there are other metal layer shapes either fully or partially covering a particular edge, the effect being called fringe-up and fringe-down capacitance. Thus, when calculating the line-to-line capacitance from one edge to another conductor on the same level, the differences caused by fringe-up and fringe-down must be accounted for.

The first step 252 is to remove the portions of the edges of that tile which contact a conductor on the same level directly, and thus create no line-to-line capacitance. The next step 254 is to search for other shapes on the same level of the tile. The remaining edge portions of the tile (those that did not intersect a conductor of the same level directly) are then subjected to a recursive intersect/complement series to determine what edge portions are adjacent to other shape portions of the same level. The area is searched for other conductors, which are not on the same electrical net and are within a predetermined distance to the tile on the same level. After these conductors, if any are located, the next step 256 is to create capacitance components for each edge portion. The capacitance components thus created each have uniform fringe line-to-line environments.

Next, these fringe capacitance components are further decomposed into capacitance components that have uniform parasitic capacitance environments with regard to fringe-up and fringe-down capacitance. The next step 258 in the preferred method is to search the above layers for shapes that cover all or a portion of a tile edge. If such a shape is found, then the next step 260 is to further decompose the capacitance components for that edge. This is because the process of computing the line-to-line capacitance differs based on the portions of the edges that are covered by each different shape above, as well as any portion of the edge that does not have a shape above it.

Next decision 262 determines if the entire edge of the tile has been searched for shapes that cover all or a portion of the tile edge. If not, the process returns to step 258, to further search the area above the tile. If it has, the next step 264 searches the layers below for shapes that overlap all or a portion of a tile edge. If such a shape is found, then the next step 266 is to further decomposed the fringe capacitance components for that edge.

Next decision 268 determines if the entire edge of the tile has been searched for shapes that overlap all or a portion of the tile edge. If not, the process returns to step 264, to further search the area below the tile. If it has, the process ends, having completely decomposed the tile edges into sections of uniform fringe capacitance environments.

When completed, each tile edge is decomposed into a plurality of fringe parasitic components, each having a uniform parasitic capacitance environment, within a specified tolerance, with regard to both fringe line-to-line and fringe up and down elements. By later computing these fringe parasitic capacitance components (as part of step 116) and summing these fringe capacitance components, the fringe capacitance of the semiconductor device can be accurately determined.

Now, returning to FIG. 3, the next step 112 is to calculate the geometric dimensions necessary for computing each capacitance component of each tile. The geometric dimensions calculated will vary according to the algorithm used for determining the tile capacitance components. In a preferred embodiment, the geometrical dimensions would include areas of overlap components, length of fringe capacitance component edges, distance of fringe capacitance component edges to adjacent shapes on the same level.

The next step 114 is to build a capacitance component geometry data file 50. The geometry data file 50 stores the geometric dimensions calculated for each capacitance component of each tile of the semiconductor device. Additionally, the geometry data file 50 stores the netlist name and the layer name that each tile belongs to, and the netlist names and layer names of shapes involved in each capacitance component of that tile (such as for shape above, below, adjacent, etc.).

The geometry data file can be simplified by removing capacitance components between tiles that belong to the same net, and summing parallel capacitance components that are between the same pair of nets.

The next step 116 is to calculate the capacitance for each capacitance component for each tile of the semiconductor device. The capacitance is calculated using the methods stored in a rules for 3D capacitance data file 60. Rules for 3D capacitance data file 60 can be a file that contains the equations to be used or can be an executable file which can automatically make the necessary calculations.

The parameters necessary, in particular the geometries of the device, for the calculation of the capacitance components are in geometry data file 50. The method for calculating the capacitance components can be equation based or table look-up approximation methods. Preferably, the capacitance for each capacitance component is calculated using rules that preserve the appropriate partitioning of electromagnetic field lines between the conductors above, below, to the left, and to the right of that particular capacitance component.

Preferred Capacitance Component Model

With the tiles decomposed into overlap-up, overlap-down and fringe capacitance components, the preferred method uses a model with elements for calculating the parasitic capacitance for overlap-up and overlap-down parasitic capacitance components. Additionally, the preferred model has elements of fringe-up, fringe-down and fringe line-to-line parasitic capacitance for calculating the parasitic capacitance of both the left and right fringe capacitance components.

In particular the preferred capacitance model for the capacitance of a line consists of an overlap-up and overlap-down element, a left edge fringe-up and fringe-down element, a right edge fringe-up and fringe-down element, a left edge fringe line-to-line element and a right edge fringe line-to-line element. It should be noted that the directional terms are meant to be used to distinguish a first component from a second, and do not limit the application to a physical direction. In particular, the capacitance of conductor line, $C_L$, is $$C_L = C_{overlap\text{-}up} + C_{overlap\text{-}down} + \quad (1)$$
$$C_{left\text{-}edge\text{-}fringe\text{-}up} + C_{left\text{-}edge\text{-}fringe\text{-}down} +$$
$$C_{right\text{-}edge\text{-}fringe\text{-}up} + C_{right\text{-}edge\text{-}fringe\text{-}down} +$$
$$C_{left\text{-}edge\text{-}line\text{-}to\text{-}line} + C_{right\text{-}edge\text{-}line\text{-}to\text{-}line}$$

The overlap elements, $C_{overlap\text{-}down}$ and $C_{overlap\text{-}up}$ are respectively the area capacitance to the substrate (or wiring level below) and the area capacitance to the wiring level above, if there is one. $C_{left\text{-}edge\text{-}fringe\text{-}up}$, $C_{left\text{-}edge\text{-}fringe\text{-}down}$, $C_{right\text{-}edge\text{-}fringe\text{-}up}$, $C_{right\text{-}edge\text{-}fringe\text{-}down}$ are the fringe-up and fringe-down capacitance elements of the left and right edge respectively. $C_{left\text{-}edge\text{-}line\text{-}to\text{-}line}$ and $C_{right\text{-}edge\text{-}line\text{-}to\text{-}line}$ are the fringe coupling capacitance elements from the left edge to a nearby edge on the same level and from the right edge to nearby edge on the same level respectively. The summation of these elements comprises the total line parasitic capacitance.

The preferred capacitance models use a semi-cylindrical approximation for the edges of the conductors. Thus, the following equations use the semi-cylindrical model to calculate the overlap, fringe line-to-line, and fringe-up and fringe-down capacitance elements. The preferred capacitance model uses the following terms.

$C_{overlap}$   overlap (both up and down) capacitance of a conductor shape ($fF/\mu m$)

$C_a$   unit area capacitance ($fF/\mu m^2$)

$C_{fringe\text{-}up}$   fringeup (either left or right edge) capacitance of a conductor per unit length ($fF/\mu m$)

$C_{fringe\text{-}down}$   fringe-down (either left or right edge) capacitance of a conductor per unit length ($fF/\mu m$)

$C_{line\text{-}to\text{-}line}$   fringe line-to-line (either left or right edge) coupling capacitance within the same wiring level per unit edge ($fF/\mu m$)

$\epsilon_{oxide}$   is the permittivity of the dielectric that insulates between wiring levels ($fF/\mu m$)

$h$   equivalent dielectric thickness between the conductor and a nearby conductor level (either above and below) or the substrate ($\mu m$)

$h_A$   equivalent dielectric thickness between the conductor and a conductor level ABOVE ($\mu m$)

$h_B$   equivalent dielectric thickness between the conductor and a conductor level or substrate BELOW ($\mu m$)

$R$   radius of semi-cylinder edge approximation = $t/2$, where $t$ is the thickness of the conductor $D$   the separation distance to an adjacent conductor on the same wiring level ($\mu m$)

$d_A$   $h_A + R$ ($\mu m$), $d_B$   $h_B + R$ ($\mu m$), $d_D$   $D/2 + b't$ ($\mu m$), $\omega, \omega'$   partitioning angles for the fringes to a conducting level above and below (radians)

$v, v', v''$   electric flux contour angle (radians)

$k, k', k''$   vertex variables $W$   wafer dimension width ($\mu m$) of a conductor $b'$   offset factor, selected to best model capacitance measurements of real devices, generally = .25

$t$   thickness of conductor shape $P$   partitioning function $\delta$   constant, $\delta = 1 \times 10^{-9}$ Preferred Overlap Capacitance Components Model A preferred capacitance model for the overlap capacitance components uses a semi-cylindrical approximation for the edges of conductor lines. The following closed-form equations use the semi-cylindrical model to calculate the overlap, fringe line-to-line, and fringe up and down capacitance. Because a semi-cylindrical approximation is used, the wafer dimension width of the shape W, as adjusted for process variations by technology data file 20, is reduced by an offset of 2b't. Thus, the overlap (parallel plate) capacitance element of a shape, per unit length, $C_{overlap}$, is calculated according to:

$$C_{overlap} = C_a(W - 2b't) \ (fF/\mu m) \tag{2}$$

where $C_a$ is the unit area capacitance, defined as:

$$C_a = \epsilon_{oxide}/h \ (fF/\mu m^2) \tag{3}$$

From this model, both the overlap-up and overlap-down capacitance components of each tile, of each shape, in the semiconductor device can be determined. The components can then be summed to find the total overlap capacitance.

Preferred Fringe Capacitance Component Models

A preferred capacitance model for fringe capacitance components also uses a semi-cylindrical approximation for the edge of lines. In particular, the model partitions each fringe capacitance component into three elements, a part that fringes to a wiring level above, a part that fringes to the wiring level below or the substrate, and a part that line-to-line couples to the nearest adjacent line.

The partitioning between fringe-up and fringe-down, and fringe line-to-line elements is computed using two partitioning angles. The partitioning angles $\omega$, for the fringe up, and $\omega'$, for the fringe down, are defined as:

$$\omega = (1 - P)\left[\frac{\pi}{2} - 2\arctan\left(\frac{h_A - h_B}{h_A + h_B}\right)\right] \tag{4}$$

$$\omega' = (1 - P)\left[\frac{\pi}{2} + 2\arctan\left(\frac{h_A - h_B}{h_A + h_B}\right)\right] \tag{5}$$

where the partitioning function, P, is defined as;

$$P = 1.5 \frac{R}{d_D} \exp\left(-\frac{R}{d_A}\right) \exp\left(-\frac{R}{d_B}\right) \tag{6}$$

Preferred Fringe-up Capacitance Model

The fringe-up capacitance element is calculated according to:

$$C_{fringe-up} = \frac{\epsilon_{oxide}(\pi - v)}{\cosh^{-1}\left(\frac{d_A}{R}\right)} \tag{7}$$

where the electric flux contour angle $v$ is, $$v = \pi \left[\frac{k\left(1 - \frac{\omega}{\pi}\right)}{k + \frac{\omega}{\pi}}\right] \tag{8}$$

The vertex variable k in the equation for the electric flux contour angle $v$ is, $$k = \frac{\left(\frac{\lambda}{\pi}\right)^2}{\left(1 + \delta - \frac{2\lambda}{\pi}\right)} \tag{9}$$

where, $$\lambda = \arccos\left(\frac{\frac{R}{d_A}}{\frac{\sqrt{d_A^2 - R^2}}{d_A} + 1}\right) \tag{10}$$

For the fringe-up element, when there are no conducting levels above, i.e., $h_A$ goes to infinity and the arctan function is $\pi/4$, and the partitioning angle $\omega$ is at its limiting value, $\omega=0$. The corresponding electric flux contour $v$ equals $\pi$, which results in a fringe-up capacitance equal to zero.

From this model, the fringe-up elements of both the right and left edge of each tile in the semiconductor device can be determined. The elements can then be summed to find the total fringe-up capacitance.

Preferred Fringe-down Capacitance Model

The fringe-down capacitance element is calculated according to:

$$C_{fringe-down} = \frac{\epsilon_{oxide}(\pi - v')}{\cosh^{-1}\left(\frac{d_B}{R}\right)} \tag{11}$$

where the electric flux contour angle $v'$ is, $$v' = \pi \left[\frac{k'\left(1 - \frac{\omega'}{\pi}\right)}{k' + \frac{\omega'}{\pi}}\right] \tag{12}$$

The vertex variable k' in the equation for the electric flux contour angle $v'$ is:

$$k' = \frac{\left(\frac{\lambda'}{\pi}\right)^2}{\left(1 + \delta - \frac{2\lambda'}{\pi}\right)} \tag{13}$$

where, $$\lambda' = \arccos\left(\frac{\frac{R}{d_B}}{\frac{\sqrt{d_B^2 - R^2}}{d_B} + 1}\right) \tag{14}$$

From this model, the fringe-down elements of both the right and left edge of each tile in the semiconductor device can be determined. The elements can then be summed to find the total fringe-down capacitance.

Preferred Fringe Line-to-Line Capacitance Model

A preferred capacitance model for fringe line-to-line capacitance elements also uses the semi-cylindrical model, and is also derived from the partitioning angles $\omega$ and $\omega'$. The preferred line-to-line model is:

$$C_{line-to-line} = \frac{\epsilon_{oxide}\Delta v}{2\cosh^{-1}\left(\frac{d_D}{R}\right)} \tag{15}$$

and, $$\Delta v = 2[\pi - (\omega + \omega')]\left(1 - \frac{F}{\pi}\right) \tag{16}$$

The constant F is related to distance D, the separation to the nearest adjacent line on the same level, and is defined as, $$F = \frac{0.5k''\pi}{(k'' + 0.5)} \tag{17}$$

where, $$k'' = \frac{\left(\frac{\lambda''}{\pi}\right)^2}{\left(1 + \delta - \frac{2\lambda''}{\pi}\right)} \tag{18}$$

-continued where, $$\lambda'' = \arccos\left(\frac{\frac{R}{d_D}}{\frac{\sqrt{d_D^2 - R^2}}{d_D} + 1}\right) \quad (19)$$

and where $d_D = D/2 + b't$ (μm), where D=separation distance (μm) to an adjacent conductor on the same wiring level.

When separation distance D approaches infinity, the variable $d_D$ also approaches infinity. This case, which occurs when there is no adjacent line present, causes the partitioning function P to be zero, indicating that no part of the semi-cylinder fringes to an adjacent line. Then $\omega + \omega' = \pi$ and thus $\Delta v$ is zero.

From this model, the fringe line-to-line elements of both the right and left edge of each tile in the semiconductor device can be determined. The elements can then be summed to find the total fringe line-to-line capacitance.

The fringe capacitance models described here use a semi-cylindrical approximation for the edges of the conductors. Using these models a 3D capacitance calculation can be made for each section of a conductor shape producing capacitance values; overlap-up, overlap-down and for each edge of each shape; fringe-up, fringe-down, and fringe line-to-line.

The next step 118 is to output the calculated capacitances. The preferred method allows for flexible outputs in a variety of forms. In particular, the outputs of the preferred method 100 are in three forms. The first output is a lumped value of total parasitic capacitance that is voltage-independent of each electrical net. This normally excludes capacitance's that are modeled as part of the electrical elements such as transistors.

The second output is a summary breakdown of total net capacitance into categories, such as line-to-line capacitance, fringe capacitance between conducting layers, and area capacitance between conducting layers. Also included are estimates of the voltage-dependent capacitances such as transistor capacitance and diffusion junction capacitance. This facilitates the search for layout changes which would reduce circuit delay.

The third output is an ordered list of nets with the highest estimated percentage of coupling capacitance due to line-to-line capacitance. This allows for analysis of potential layout changes to avoid cross-talk problems.

Of course, other forms of output are possible by manipulation of the detailed capacitance values.

Turning now to FIGS. 6-11. FIGS. 6-11 illustrate a portion of semiconductor device and will be used to illustrate a simplified application of a preferred embodiment of a capacitance calculation method in accordance with the present invention.

FIG. 6 is a partially transparent top view of a portion of a semiconductor device 300. The semiconductor device 300 is shown as partially transparent to illustrate various elements that are part of semiconductor device 300. The various elements include a portion 302 of the third metal layer M3, a first portion 304 of the second metal layer M2, a second portion 306 of second metal layer M2, a portion 308 of the first metal layer M1, and a portion 310 of polysilicon layer PC. The various elements represent the types of structures that are found in semiconductor devices, including conductors and discrete elements. Of course, the semiconductor device 300 could contain different types of elements not illustrated, specifically transistors and such. In semiconductor device design, the various elements in semiconductor device 300 are stored as "shapes."

In the preferred embodiment, first portion 304 of the second metal layer M2 is divided up into a plurality of tiles, the tiles comprising butted rectangles. This division into tiles typically occurs as part of step 102 of FIG. 2. As an example, a first tile, illustrated by dotted box 311, extends down and has a width equal to first portion 304 of first metal layer M2. Likewise, other tiles, not shown in FIG. 6, would exist on either end of tile 311, such that the entire portion 304 is encompassed in tiles.

Turning now to FIG. 7. FIG. 7 is a cross sectional side view of a portion of semiconductor device 300 taken along line 7—7 of FIG. 6. A cross section is shown of portion 302 of third metal layer M3, first portion 304 of second metal layer M2, portion 308 of first metal layer M1, and portion 310 of polysilicon layer PC, in FIG. 5. Again, the tile 311 partitions first portion 304 of second metal layer M2 as illustrated by lines 313 and 315.

According to step 104 of FIG. 2, a quad-tree data base is created containing the parameters of semiconductor device 300. The quad-tree data base is a relational database that stores the parameters of semiconductor device 300, including the number and arrangement of the shapes of the semiconductor device, as well as the tiles in each shape. In particular, the quad-tree data base would store the location and parameters of portion 302 of the third metal layer M3, first portion 304 of the second metal layer M2, second portion 306 of second metal layer M2, portion 308 of the first metal layer M1, and portion 310 of polysilicon layer PC. The location of all tiles on the semiconductor shapes is also stored.

Then, according to step 106, the quad-tree data base, and all its stored parameters, are converted to wafer dimensions. Thus, all parameters stored in quad-tree data base will accurately reflect the semiconductor device 300 as produced in fabrication. Additionally, according to step 108, a netlist database is built containing the net parameters of semiconductor device 300.

Figure 8:
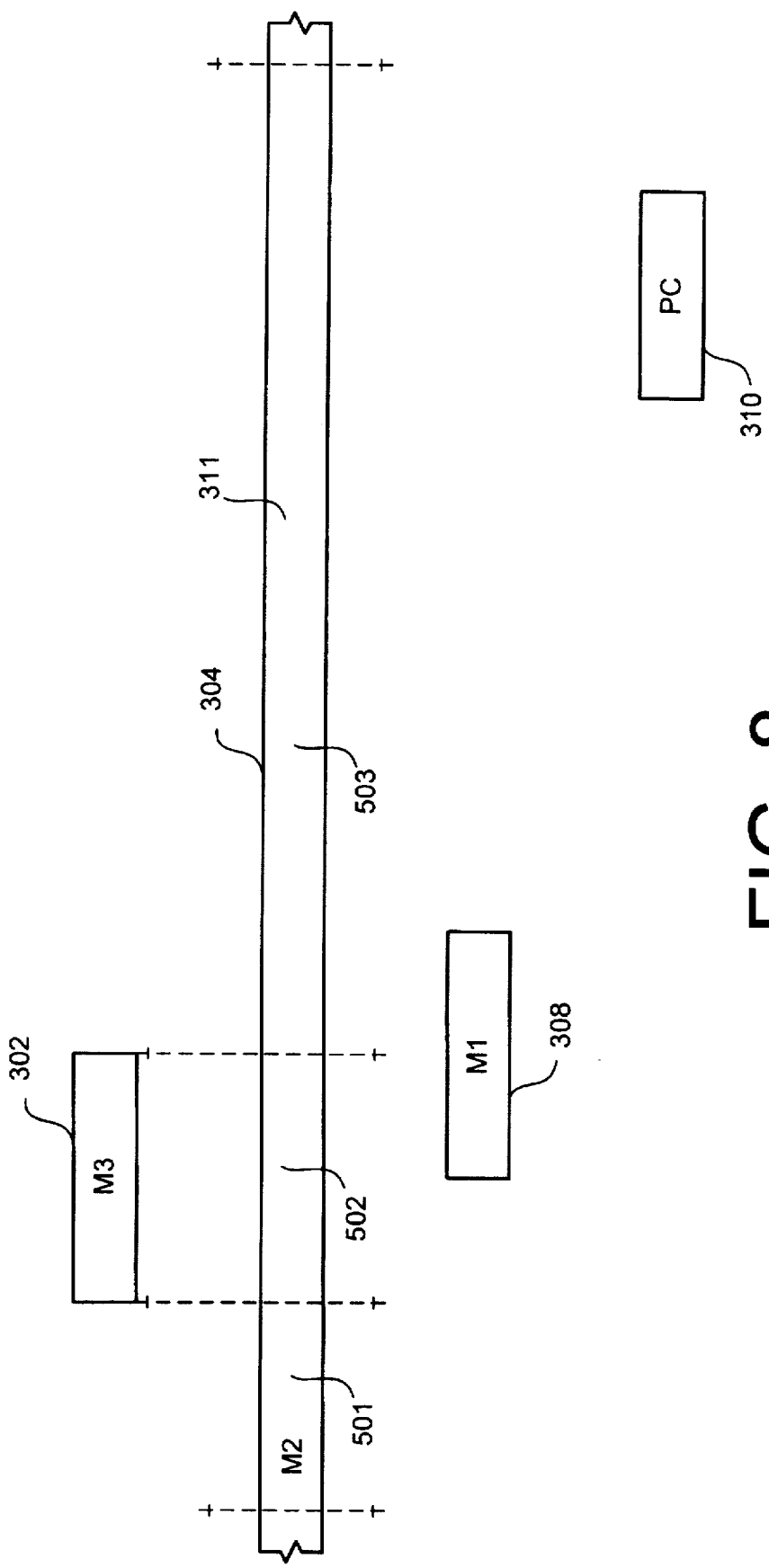
FIG. 8 is a schematic side view of a portion of a semiconductor device.

The next step 110 of FIG. 3 is to partition the tiles of semiconductor device 300 into capacitance components. Turning now to FIG. 8. FIG. 8 is a schematic side view of a portion of semiconductor device 300 which shows tile 311 decomposed into plurality of overlap-up capacitance components, numbered 501-503. The decomposition preferably is done using the method illustrated in FIG. 4, and results in overlap-up capacitance components all having uniform capacitance environments with regard to overlap-up capacitance. In particular, the three overlap-up capacitance components, with their corresponding nearby shape elements are illustrated in Table 1.

TABLE 1

| Overlap-Up Component | Shape Above |
|---|---|
| 501 | none |
| 502 | M3 |
| 503 | none |

Of course, overlap-up capacitance can exist even where there is no conductor shape above, created by the additions of interconnect wiring. Thus overlap-up components are created for sections that do not have any conductor shapes above, to be used in computing overlap-up capacitances later if necessary.

Figure 9:
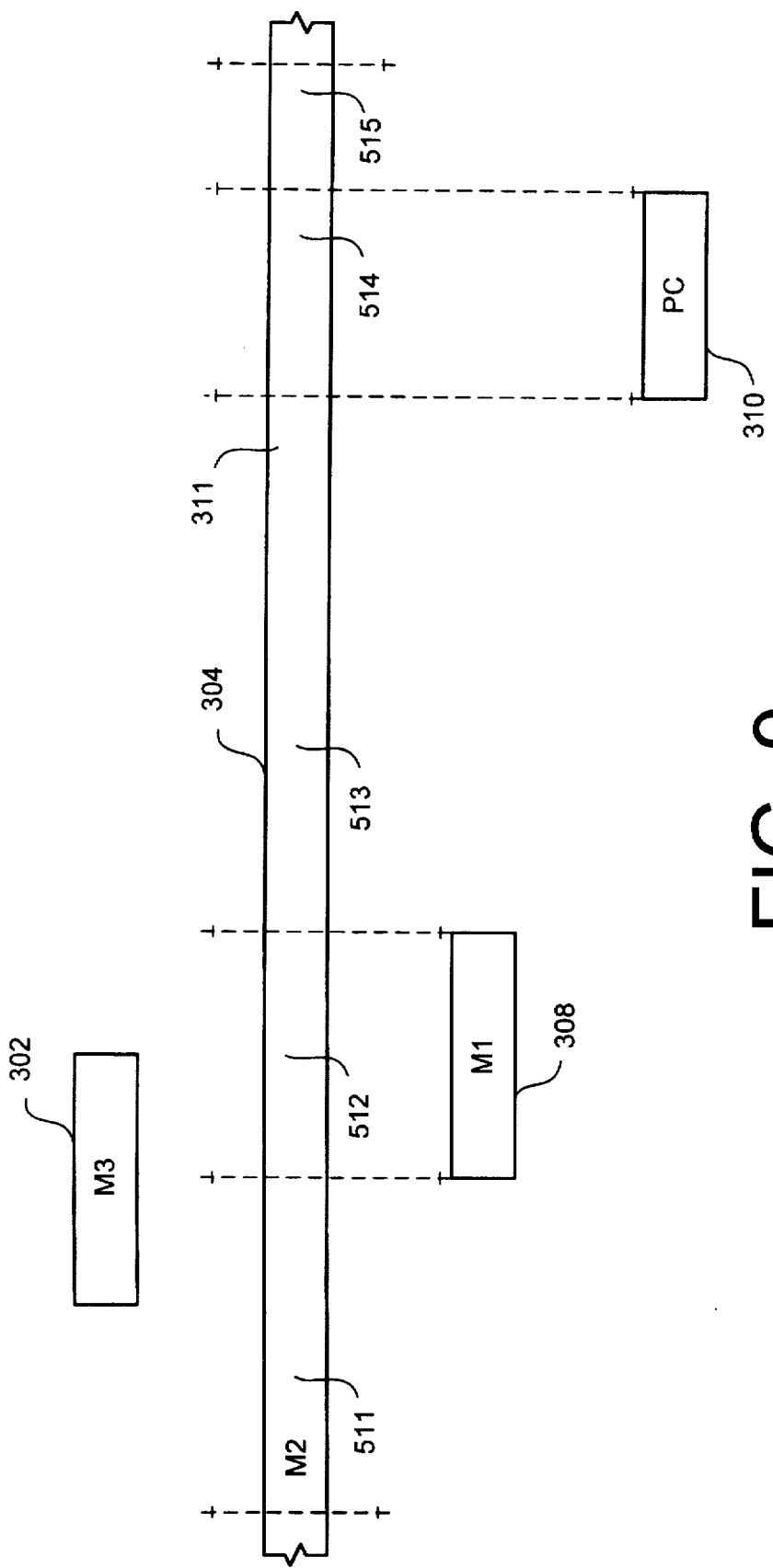
FIG. 9 is a schematic side view of a portion of a semiconductor device.

Turning now to FIG. 9, tile 311 is likewise decomposed into a plurality of overlap-down capacitance components, numbered 511–515. Again, this is done as part of the method illustrated in FIG. 4, and results in overlap-down capacitance components all having uniform capacitance environments with regard to overlap-down capacitance. In particular, the five overlap-down capacitance components, with their corresponding nearby shape elements are illustrated in Table 2.

TABLE 2

| Overlap-down Component | Shape Below |
|---|---|
| 511 | none |
| 512 | M1 |
| 513 | none |
| 514 | PC |
| 515 | none |

Generally overlap-down capacitance exists even where there is no conductor shape below. This is because overlap-down capacitance is created between the tile and the substrate of the semiconductor device. Thus, all components 511–515 are created in the decomposition process to be used later if necessary.

Figure 10:
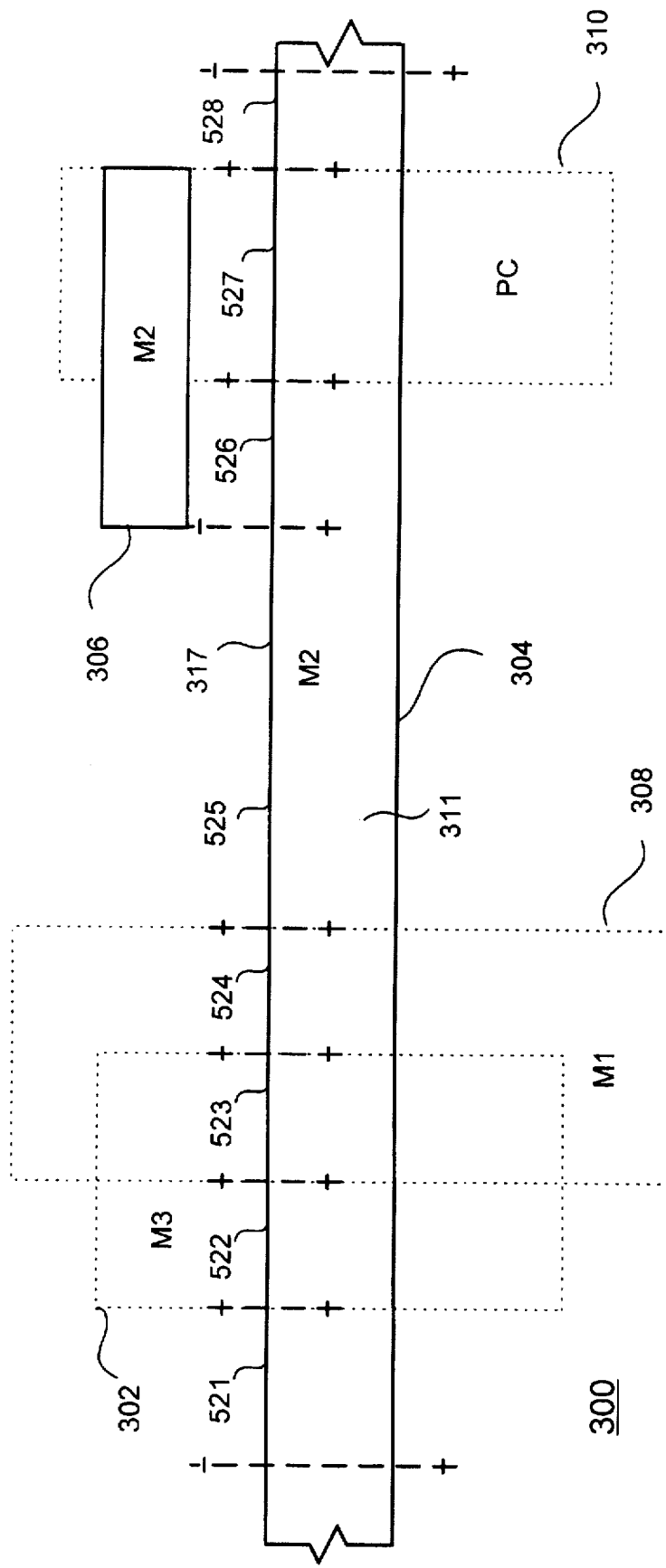
FIG. 10 is a schematic top view of a portion of a semiconductor device.

Turning now to FIG. 10, FIG. 10 is a schematic top view of a portion of semiconductor device 300 which shows the left edge 317 of tile 311 decomposed into a plurality of fringe capacitance components, numbered 521–528. The decomposition preferably is done using the method illustrated in FIG. 5, and results in fringe capacitance components all having uniform capacitance environments with regard to fringe capacitance. In particular, the left edge fringe capacitance components 521–528 each have a uniform capacitance environment with regard to fringe-up and fringe-down, and fringe line-to-line capacitance. Specifically, the fringe capacitance components 521–528, with their corresponding nearby shape elements are illustrated in Table 3.

TABLE 3

| Left Edge Fringe Cap Component | Shape Above Edge | Shape Below Edge | Shape Left of Edge |
|---|---|---|---|
| 521 | none | none | none |
| 522 | M3 | none | none |
| 523 | M3 | M1 | none |
| 524 | none | M1 | none |
| 525 | none | none | none |
| 526 | none | none | 2nd M2 |
| 527 | none | PC | 2nd M2 |
| 528 | none | none | none |

Figure 11:
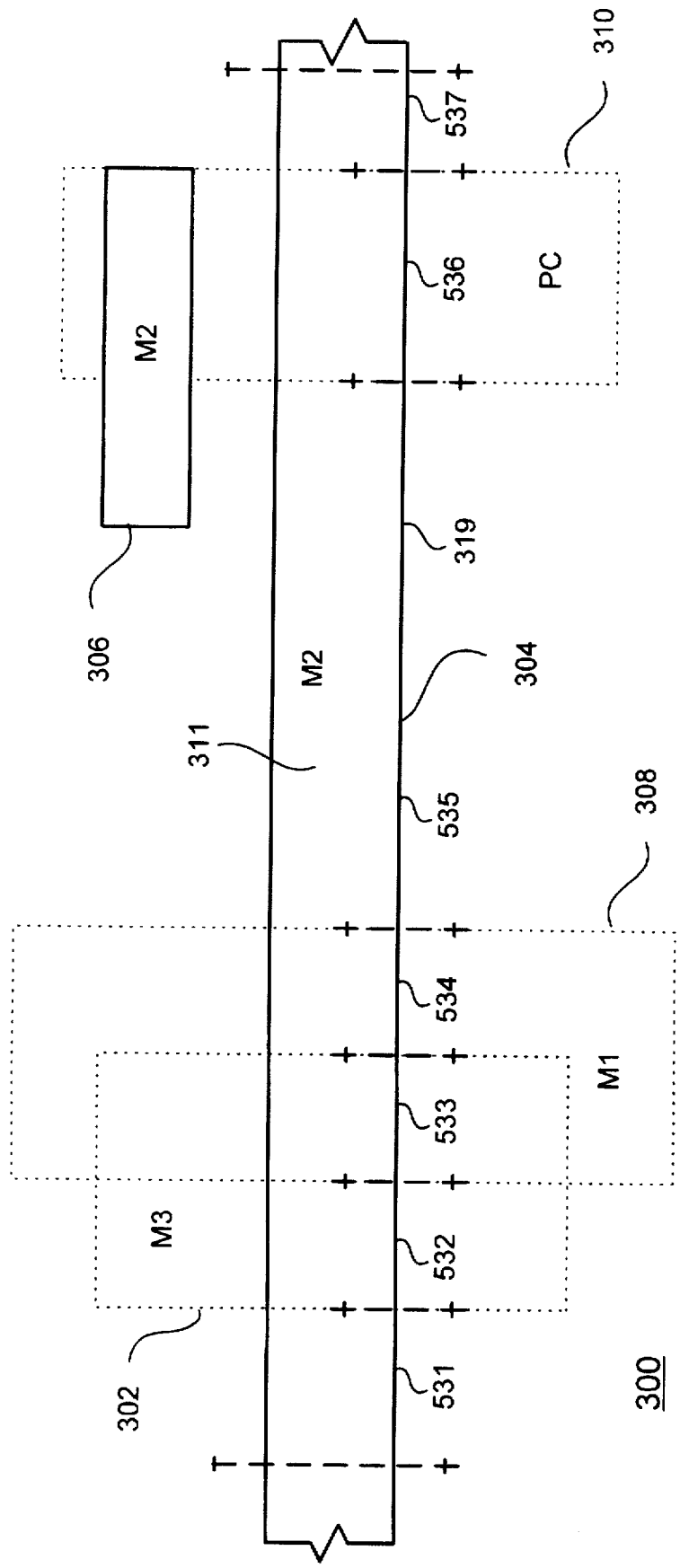
FIG. 11 is a schematic top view of a portion of a semiconductor device.

Turning now to FIG. 11, the right edge 319 of tile 311 is also decomposed into a plurality of fringe capacitance components, numbered 531–537. Again, the decomposition preferably is done as part of the method illustrated in FIG. 5, and results in fringe capacitance components all having uniform capacitance environments with regard to fringe capacitance. In particular, the left edge fringe capacitance components 531–537 each have a uniform capacitance environment with regard to fringe-up and fringe-down, and fringe line-to-line capacitance. Specifically, the fringe capacitance components 531–537, with their corresponding nearby shape elements are illustrated Table 4.

Again, fringe-up and fringe-down capacitance can exist even where no shapes are above or below, caused by interconnect wiring and the substrate respectively. Thus, all components 521–528 are created in the decomposition process to be used later if necessary.

TABLE 4

| Right Edge Fringe Cap Component | Shape Above Edge | Shape Below Edge | Shape Right of Edge |
|---|---|---|---|
| 531 | none | none | none |
| 532 | M3 | none | none |
| 533 | M3 | M1 | none |
| 534 | none | M1 | none |
| 535 | none | none | none |
| 536 | none | PC | none |
| 537 | none | none | none |

Again, fringe-up and fringe-down capacitance can exist even where no shapes are above or below, caused by interconnect wiring and the substrate respectively. Thus, all components 531–537 are created in the decomposition process to be used later if necessary.

Thus, the tile 311 is decomposed into capacitance components that have uniform parasitic environments with regard to overlap-up, overlap-down, fringe-up, fringe-down and fringe line-to-line capacitance.

After each of the tiles are partitioned into capacitance components, according to step 112 of FIG. 3, the geometric dimensions of each component are calculated using the shapes quad-tree data base 30. These dimensions are then stored in geometry data file 50. In the example of FIGS. 6–11, the geometric dimensions stored would include the areas of overlap components, length of fringe capacitance component edges, and the distance of fringe capacitance component edges to adjacent shapes on the same level. Thus, all the needed geometric dimensions to calculate all of the capacitance components of semiconductor device 300 are stored in geometry data file 50.

According to step 116 of FIG. 3, after the geometric dimensions for each capacitance component are calculated and stored, the various capacitance components can be calculated using the geometry data file 50, technology data file 20, and rules for 3D capacitance data file 60.

In the example of FIGS. 6–11 the capacitance for all capacitance components 501–503, 511–515, 521–528, and 531–537 would all be computed using the preferred capacitance equations. As specific examples, overlap-up capacitance component 502 would be calculated according to equation (2). Likewise, the left edge fringe capacitance component 527 would be calculated according to equation (11) for fringe-down capacitance and equation (15) for fringe line-to-line capacitance. Additionally, equation (7) would be used to calculate any fringe-up capacitance of left edge fringe capacitance component 527 create by global interconnect wiring.

In accordance with the present invention, these capacitance components would each be calculated with reference to an accurate wafer-level dimension, including compensation for differences between fabrications processes.

The next step of FIG. 3 is to output the capacitance calculations. The preferred embodiment allows the outputs to take a variety of forms, depending upon the needs of the user. In particular, the method is adaptable to output a variable level of detail in its output.

Thus described, the preferred embodiment allows an efficient and accurate method of computing the parasitic capacitance of a semiconductor device. In particular, the preferred method is adaptable to a wide range of technologies. The preferred method also can be used to compute the parasitic capacitance of a wide range of devices. Including VLSI devices, and multi-layer chip packages.

While the invention has been particularly shown and described with reference to a preferred exemplary embodiment thereof, it will be understood by those skilled in the art that various change in form and details may be made therein without departing from the spirit and scope of the invention.

We claim:

1. A computer apparatus comprising:
   (a) a central processing unit;
   (b) a memory, said memory accessible by said central processing unit, said memory containing an executable program; wherein said program comprises:
      i) a shape file input mechanism, wherein said input mechanism is adapted for inputting a shape file containing layout shapes of a semiconductor device, said layout shapes partitioned into a plurality of tiles;
      ii) a decomposer, wherein said decomposer is adapted for decomposing said tiles of said shapes into a plurality of parasitic capacitance components, said plurality of parasitic capacitance components including fringe capacitance components having substantially uniform parasitic capacitance with regard to fringe capacitance and overlap capacitance components having substantially uniform parasitic capacitance with regard to overlap capacitance; and
      iii) a parasitic capacitance calculator, wherein said parasitic capacitance calculator is adapted for computing parasitic capacitance of each of said plurality of tiles, said parasitic capacitance computation including calculation of the capacitance of each of said plurality of parasitic capacitance components.

2. The computer apparatus of claim 1 wherein said overlap capacitance components include a plurality of overlap-up components and a plurality of overlap-down components and wherein said fringe capacitance components include a plurality of first edge fringe components, and a plurality of second edge fringe components.

3. The computer apparatus of claim 2 wherein said plurality of overlap-up capacitance components and said plurality of overlap-down capacitance components each have uniform parasitic capacitance environments within a predetermined tolerance with respect to overlap capacitance and wherein said plurality of first edge fringe components and said plurality of second edge fringe components each have a uniform parasitic capacitance environment within a predetermined tolerance with respect to fringe-up capacitance, fringe-down capacitance, and fringe line-to-line capacitance.

4. The computer apparatus of claim 1 wherein said parasitic capacitance calculator is adapted for calculating overlap capacitance of said overlap capacitance components, and for calculating fringe-up capacitance, fringe-down capacitance, and fringe line-to-line capacitance.

5. The computer apparatus of claim 1 wherein said decomposer is adapted to decompose said tiles of said shapes into a plurality of parasitic capacitance components by:
   i) decomposing said pluralities of tiles into said overlap capacitance components by recursively intersecting said tiles with shapes above and below said tile in said semiconductor device; and
   ii) decomposing said plurality of tiles into said fringe capacitance components by intersecting edges of each of said plurality of tiles with adjacent shapes and then further partitioning for shapes above and below said edges.

6. The computer apparatus of claim 1 wherein said layout shape file includes a wafer dimension shape file.

7. The computer apparatus of claim 6 wherein said wafer dimension shape file is created from a shape file and said technology data file.

8. The computer apparatus of claim 7 wherein said technology data file comprises an executable file programed to adjust dimensions of the shape file to wafer dimensions corresponding to said technology data.

9. The computer apparatus of claim 1 wherein said tiles comprise rectangles.

10. The computer apparatus of claim 1 wherein said tiles comprise trapezoids.

11. A computer apparatus for calculating a parasitic capacitance of a semiconductor device comprising:
    (a) a central processing unit;
    (b) a memory, said memory accessible by said central processing unit, said memory containing an executable program; wherein said program includes:
       i) a layout file input mechanism, wherein said layout file input mechanism is adapted for inputting a layout file, said layout file containing shapes of a semiconductor device;
       ii) a technology file input mechanism, wherein said technology file input mechanism is adapted for a inputting a technology file, said technology file adapted for adjusting dimensions of said shapes of said semiconductor device in said layout file to wafer dimensions;
       iii) a partitioner, wherein said partitioner is adapted for partitioning said shapes of said semiconductor device into a plurality of tiles, said tiles each including a portion of a semiconductor shape;
       iv) a decomposer, wherein said decomposer is adapted for decomposing said plurality of tiles of each of said plurality of shapes into a plurality of parasitic capacitance components, said plurality of parasitic capacitance components including overlap capacitance components having substantially uniform parasitic capacitance with regard to overlap capacitance and fringe capacitance components having substantially uniform parasitic capacitance with regard to fringe capacitance; and
       v) a parasitic capacitance calculator, wherein said parasitic capacitance calculator is adapted for computing capacitance of said semiconductor device by computing said plurality of parasitic capacitance components.

12. The computer apparatus of claim 11 wherein said overlap capacitance components include a plurality of overlap-up components and a plurality of overlap-down components and wherein said fringe capacitance components include a plurality of first edge fringe components, and a plurality of second edge fringe components.

13. The computer apparatus of claim 12 wherein said plurality of overlap-up capacitance components and said plurality of overlap-down capacitance components each have uniform parasitic capacitance environments within a predetermined tolerance with respect to overlap capacitance and wherein said plurality of first edge fringe components and said plurality of second edge fringe components each have a uniform parasitic capacitance environment within a predetermined tolerance with respect to fringe-up capacitance, fringe-down capacitance, and fringe line-to-line capacitance.

14. The computer apparatus of claim 11 wherein said parasitic capacitance calculator is adapted for calculating overlap capacitance of said overlap capacitance components, and for calculating fringe-up capacitance, fringe-down capacitance, and fringe line-to-line capacitance.

15. The computer apparatus of claim 11 wherein said decomposer is adapted to decompose said tiles of said shapes into a plurality of parasitic capacitance components by:

i) decomposing said pluralities of tiles into said overlap capacitance components by recursively intersecting said tiles with shapes above and below said tile in said semiconductor device; and ii) decomposing said plurality of tiles into said fringe capacitance components by intersecting edges of each of said plurality of tiles with adjacent shapes and then further partitioning for shapes above and below said edges.

16. The computer apparatus of claim 11 wherein said tiles comprise rectangles.

17. The computer apparatus of claim 11 wherein said shapes partitioned into a plurality of tiles are stored in a data base having a quad tree data structure.

18. A program product comprising:
a) a recordable media; and
b) a program recorded on said recordable media, the program used to calculate the parasitic capacitance of a semiconductor device, the program including:
  i) a shape file input mechanism, wherein said input mechanism is adapted for inputting a shape file containing layout shapes of a semiconductor device, said layout shapes partitioned into a plurality of tiles;
  ii) a decomposer, wherein said decomposer is adapted for decomposing said tiles of said shapes into a plurality of parasitic capacitance components, said plurality of parasitic capacitance components including fringe capacitance components having substantially uniform parasitic capacitance with regard to fringe capacitance and overlap capacitance components having substantially uniform parasitic capacitance with regard to overlap capacitance; and
  iii) a parasitic capacitance calculator, wherein said parasitic capacitance calculator is adapted for computing parasitic capacitance of each of said plurality of tiles, said parasitic capacitance computation including calculation of the capacitance of each of said plurality of parasitic capacitance components.

19. The program product of claim 18 wherein said overlap capacitance components include a plurality of overlap-up components and a plurality of overlap-down components and wherein said fringe capacitance components include a plurality of first edge fringe components, and a plurality of second edge fringe components.

20. The program product of claim 19 wherein said plurality of overlap-up capacitance components and said plurality of overlap-down capacitance components each have uniform parasitic capacitance environments within a predetermined tolerance with respect to overlap capacitance and wherein said plurality of first edge fringe components and said plurality of second edge fringe components each have a uniform parasitic capacitance environment within a predetermined tolerance with respect to fringe-up capacitance, fringe-down capacitance, and fringe line-to-line capacitance.

21. The program product of claim 18 wherein said parasitic capacitance calculator is adapted for calculating overlap capacitance of said overlap capacitance components, and for calculating fringe-up capacitance, fringe-down capacitance, and fringe line-to-line capacitance.

22. The program product of claim 18 wherein said decomposer is adapted to decompose said tiles of said shapes into a plurality of parasitic capacitance components by:
i) decomposing said pluralities of tiles into said overlap capacitance components by recursively intersecting said tiles with shapes above and below said tile in said semiconductor device; and ii) decomposing said plurality of tiles into said fringe capacitance components by intersecting edges of each of said plurality of tiles with adjacent shapes and then further partitioning for shapes above and below said edges.

23. A method for calculating parasitic capacitance in semiconductor circuit design, comprising the steps of:
a) inputting a shape file, said shape file containing layout shapes of a semiconductor device;
b) decomposing said shapes into a plurality of parasitic capacitance components, said plurality of parasitic capacitance components including fringe capacitance components having substantially uniform parasitic capacitance with regard to fringe capacitance and overlap capacitance components having substantially uniform parasitic capacitance with regard to overlap capacitance; and
c) computing parasitic capacitance of said semiconductor device, said computation including calculating the capacitance of each of said plurality of parasitic capacitance components.

24. The method of claim 23 wherein said overlap capacitance components include a plurality of overlap-up components and a plurality of overlap-down components and wherein said fringe capacitance components include a plurality of first edge fringe components, and a plurality of second edge fringe components.

25. The method of claim 24 wherein said plurality of overlap-up capacitance components and said plurality of overlap-down capacitance components each have uniform parasitic capacitance environments within a predetermined tolerance with respect to overlap capacitance and wherein said plurality of first edge fringe components and said plurality of second edge fringe components each have a uniform parasitic capacitance environment within a predetermined tolerance with respect to fringe-up capacitance, fringe-down capacitance, and fringe line-to-line capacitance.

26. The method of claim 23 wherein said parasitic capacitance is calculated by calculating overlap capacitance of said overlap capacitance components and by calculating fringe-up capacitance, fringe-down capacitance, and fringe line-to-line capacitance.

27. The method of claim 23 wherein said shapes are partitioned into tiles and wherein said step of decomposing shapes into plurality of capacitance components comprises decomposing said tiles of said shapes into a plurality of parasitic capacitance components by:
i) decomposing said pluralities of tiles into said overlap capacitance components by recursively intersecting said tiles with shapes above and below said tile in said semiconductor device; and ii) decomposing said plurality of tiles into said fringe capacitance components by intersecting edges of each of said plurality of tiles with adjacent shapes and then further partitioning for shapes above and below said edges.

28. The method of claim 23 wherein said fringe capacitance components comprise are fringe-up, fringe-down, and fringe line-to-line capacitances, said capacitances partitioned using partitioning angles, said partitioning angles defined as:

$$\omega = (1-P)\left[\frac{\pi}{2} - 2\arctan\left(\frac{h_A - h_B}{h_A + h_B}\right)\right] \tag{20}$$

-continued $$\omega' = (1-P)\left[\frac{\pi}{2} + 2\arctan\left(\frac{h_A - h_B}{h_A + h_B}\right)\right] \quad (21)$$

29. The method of claim 23 wherein said step of computing said parasitic capacitance comprises computing an overlap-up, overlap-down and said fringe capacitance component, wherein:

i) said overlap-up and overlap-down capacitance components are computed, where $C_{overlap}$ is the overlap capacitance, according to, $$C_{overlap} = C_o(W - 2b't) \; (fF/\mu m) \quad (22)$$

ii) said fringe capacitance component is calculated by computing a fringe-up, fringe-down, and fringe line-to-line capacitance element, and where said fringe-up capacitance, $C_{fringe-up}$, is calculated according to, $$C_{fringe-up} = \frac{\epsilon_{oxide}(\pi - v)}{\cosh^{-1}\left(\frac{d_A}{R}\right)} \quad (23)$$

wherein said fringe-down capacitance, $C_{fringe-down}$, is calculated according to, $$C_{fringe-down} = \frac{\epsilon_{oxide}(\pi - v')}{\cosh^{-1}\left(\frac{d_B}{R}\right)} \quad (24)$$

and where said fringe line-to-line capacitance, $C_{line-to-line}$, is calculated according to, $$C_{line-to-line} = \frac{\epsilon_{oxide}\Delta v}{2\cosh^{-1}\left(\frac{d_D}{R}\right)} \quad (25)$$

30. The method of claim 23 wherein said layout shape file comprises a wafer dimension shape file.

31. The method of claim 23 wherein a wafer dimension shape file is created from a shape file and said technology data file.

32. The method of claim 23 wherein said shapes are partitioned into tiles and wherein said tiles comprise abutted rectangles.

33. The method of claim 23 wherein said shapes are partitioned into tiles and wherein said tiles comprise trapezoids.

34. A computer implemented method for calculating the parasitic capacitance in a semiconductor design, comprising the steps of:

a) inputting a layout file, said layout file containing shapes of a semiconductor device;
b) inputting a technology file, said technology file adapted to adjust said shapes of said semiconductor device in said layout file to wafer dimensions;
c) partitioning said shapes of said semiconductor device into a plurality of tiles, said tiles each including a portion of a semiconductor shape;
d) decomposing said plurality of tiles of each of said plurality of shapes into a plurality of parasitic capacitance components, said plurality of parasitic capacitance components including overlap capacitance components having substantially uniform parasitic capacitance with regard to overlap capacitance and fringe capacitance components having substantially uniform parasitic capacitance with regard to fringe capacitance; and
e) computing capacitance of said semiconductor device by computing capacitance of said plurality of parasitic capacitance components.

35. The method of claim 34 wherein said overlap capacitance components include a plurality of overlap-up components and a plurality of overlap-down components and wherein said fringe capacitance components include a plurality of first edge fringe components, and a plurality of second edge fringe components.

36. The method of claim 35 wherein said plurality of overlap-up capacitance components and said plurality of overlap-down capacitance components each have uniform parasitic capacitance environments within a predetermined tolerance with respect to overlap capacitance and wherein said plurality of first edge fringe components and said plurality of second edge fringe components each have a uniform parasitic capacitance environment within a predetermined tolerance with respect to fringe-up capacitance, fringe-down capacitance, and fringe line-to-line capacitance.

37. The method of claim 34 wherein said parasitic capacitance is calculated by calculating overlap capacitance of said overlap capacitance components and by calculating fringe-up capacitance, fringe-down capacitance, and fringe line-to-line capacitance.

38. The method of claim 34 wherein said shapes are partitioned into tiles and wherein said step of decomposing shapes into plurality of capacitance components comprises decomposing said tiles of said shapes into a plurality of parasitic capacitance components by:

i) decomposing said pluralities of tiles into said overlap capacitance components by recursively intersecting said tiles with shapes above and below said tile in said semiconductor device; and
ii) decomposing said plurality of tiles into said fringe capacitance components by intersecting edges of each of said plurality of tiles with adjacent shapes and then further partitioning for shapes above and below said edges.

39. The method of claim 34 wherein the step of partitioning said shapes into a plurality of tiles further comprises storing said shapes and said tiles of said shapes in a data base.

40. The method of claim 39 wherein said data base comprises a quad-tree data structure.

41. A computer implemented method for calculating the parasitic capacitance in a semiconductor design, comprising the steps of:

a) inputting a layout file, said layout file containing shapes of a semiconductor device;
b) inputting a technology file, said technology file an executable file adapted to adjust said shapes of said semiconductor device in said layout file to wafer dimensions;
c) partitioning said shapes of said semiconductor device into a plurality of butted rectangle tiles, said tiles each including a portion of a semiconductor shape;
d) storing said wafer dimension layout shapes, said tiles of said shapes in a quad-data base
e) creating a netlist data base;
f) decomposing said plurality of tiles of said plurality of shapes into a plurality overlap-up and overlap-down parasitic capacitance components,
g) decomposing edges of said plurality of tiles of said plurality of shapes into a plurality of fringe capacitance components, each of said fringe capacitance components having a uniform parasitic capacitance environment with respect to fringe-up, fringe-down, and fringe line-to-line capacitance;

h) creating a geometry file, said geometry file containing wafer geometry dimensions corresponding to said parasitic capacitance components; and i) computing capacitance of said semiconductor device, said computing done by computing plurality of parasitic capacitance components using said wafer dimension geometry file.

* * * * *

UNITED STATES PATENT AND TRADEMARK OFFICE
CERTIFICATE OF CORRECTION

PATENT NO. : 5,761,080
DATED : June 2, 1998
INVENTOR(S) : DeCamp et al.

It is certified that error appears in the above-indentified patent and that said Letters Patent is hereby corrected as shown below:

In column 10 at line 7, the text "fingeup" should read --fringe-up--.

Signed and Sealed this

Eighteenth Day of August, 1998

Attest:

BRUCE LEHMAN

Attesting Officer      Commissioner of Patents and Trademarks